SOLID STATE AND HYBRID MODULATORS

Filed Feb. 18, 1963 2 Sheets-Sheet 1

INVENTORS.
EARL H. HECKMAN
MARTIN L. JONES
BY
H. H. Losche
ATT'YS.

INVENTORS.
EARL H. HECKMAN
MARTIN L. JONES
BY
H. H. Losche
ATT'YS.

United States Patent Office 3,274,397
Patented Sept. 20, 1966

3,274,397
SOLID STATE AND HYBRID MODULATORS

Earl H. Heckman, Severna Park, and Martin L. Jones, Baltimore, Md., assignors, by mesne assignments, to the United States of America as represented by the Secretary of the Navy Filed Feb. 18, 1963, Ser. No. 259,470
9 Claims. (Cl. 307—88.5)

This invention relates to modulators and more particularly to solid state or semiconductor modulators and to hybrid modulators using a combination of vacuum tubes and solid state devices.

Prior known vacuum tube modulators and early forms of transistor modulators have been successful in operation, but with the coming of requirements for high speed operation and high pulse repetition frequency, improved solid state or hybrid modulators for developing fast rise and fall time pulses are needed. New developments in solid state conduction devices, such as the 4-layer semiconductor diodes and the 4-layer silicon gating transistors, make new circuits possible with the capability of more rapid "on" and "off" transition periods.

In the present invention solid state and hybrid modulators are devised which will produce modulating pulses with a leading edge rise time in the order of 20 nanoseconds (ns.) and a trailing edge fall time in the order of 40 ns. These modulators utilize 4-layer silicon diodes, presently known as "Shockley" 4-layer diodes, which have two stable states, the "off" or high impedance state, and the "on" or low impedance state. To turn the diode "on," or the low impedance or conductive state, voltage across the terminals must exceed the switching voltage. Once the switching voltage is exceeded and current is flowing, the diode will continue to conduct, although the voltage across the terminals may drop below the switching voltage. The 4-layer diode is turned "off" by reducing the current flowing through the device below the holding current or the current necessary to maintain the diode in a conductive state. These 4-layer diode characteristics are more fully shown and described in the catalog C–1 of March 1961 of Shockley Transistor, Unit of Clevite Transistor, Stanford Industrial Park, Palo Alto, California.

In one embodiment of this invention, use is made of a silicon controlled rectifier and a thyristor in addition to the 4-layer diodes. The silicon controlled rectifiers are sometimes referred to as gating transistors or gating semiconductors which have an electrode coupled to the silicon layer which readily controls the semiconductor conduction. Further description of the structure and characteristics of the silicon controlled rectifying transistor may be found in the General Electric Silicon Controlled Rectifier Manual, second edition, 1961. The thyristor is known to have the characteristics of a thyratron and a transistor in that it will have a high resistance to conduction until the base voltage reaches a threshold voltage at which time conduction takes places and will continue although the base voltage drops under the threshold voltage.

In this invention a circuit is produced to modulate the grid load circuit of a traveling wave tube to obtain rapid "on" and "off" grid control voltages. In one embodiment the grid load is in circuit through a plurality of 4-layer diodes in series and a plurality of transistors in series to a high voltage source, while in another embodiment the grid load is in circuit through a plurality of 4-layer diodes in series and in series with a vacuum tube to the high voltage source. In the first embodiment a thyristor and a transistor are coupled to provide a multivibrator that is transformer coupled to the bases of the series string of transistors to produce a rapid application of high voltage to the grid load when an input pulse is applied to the multivibrator. This is termed the "on" circuit. The "on" circuit of the second embodiment includes a transformer coupled input circuit to the series string of 4-layer diodes to switch the high voltage "on" for the grid load when an input pulse is applied to the input circuit. The "off" circuit of the first embodiment is by the application of an "off" pulse on the gating electrode of a silicon controlled rectifier that is coupled through 4-layer diodes from a negative biasing source to the string of 4-layer diodes to cut off conduction from the high voltage source to the grid load. The "off" circuit of the hybrid modulator embodiment includes a triode coupled to a negative voltage source with the grid load biased to cutoff until the "off" pulse is applied to the control grid to immediately place the negative voltage in circuit with the grid load. These "on" and "off" circuits operating in co-ordination with the 4-layer diodes produce rapid rise and fall voltage modulating waves on the grid load. With these circuits "on" and "off" delays are a function of transistor and 4-layer diode characteristics which can be improved with the improvement of epitaxial transistors or transistors having orientation controlled by the crystal substrate. It is therefore a general object of this invention to provide fast rise and fall time modulating waves by control of fast acting multilayer semiconductor devices in "on" and "off" circuits to change the voltage bias and current flow in rapid succession to produce sharp square edge modulating waves.

These and other objects and the attendant advantages, features, and uses may become more apparent to those skilled in the art as the description proceeds when considered along with the accompanying drawings in which.

Figure 1:
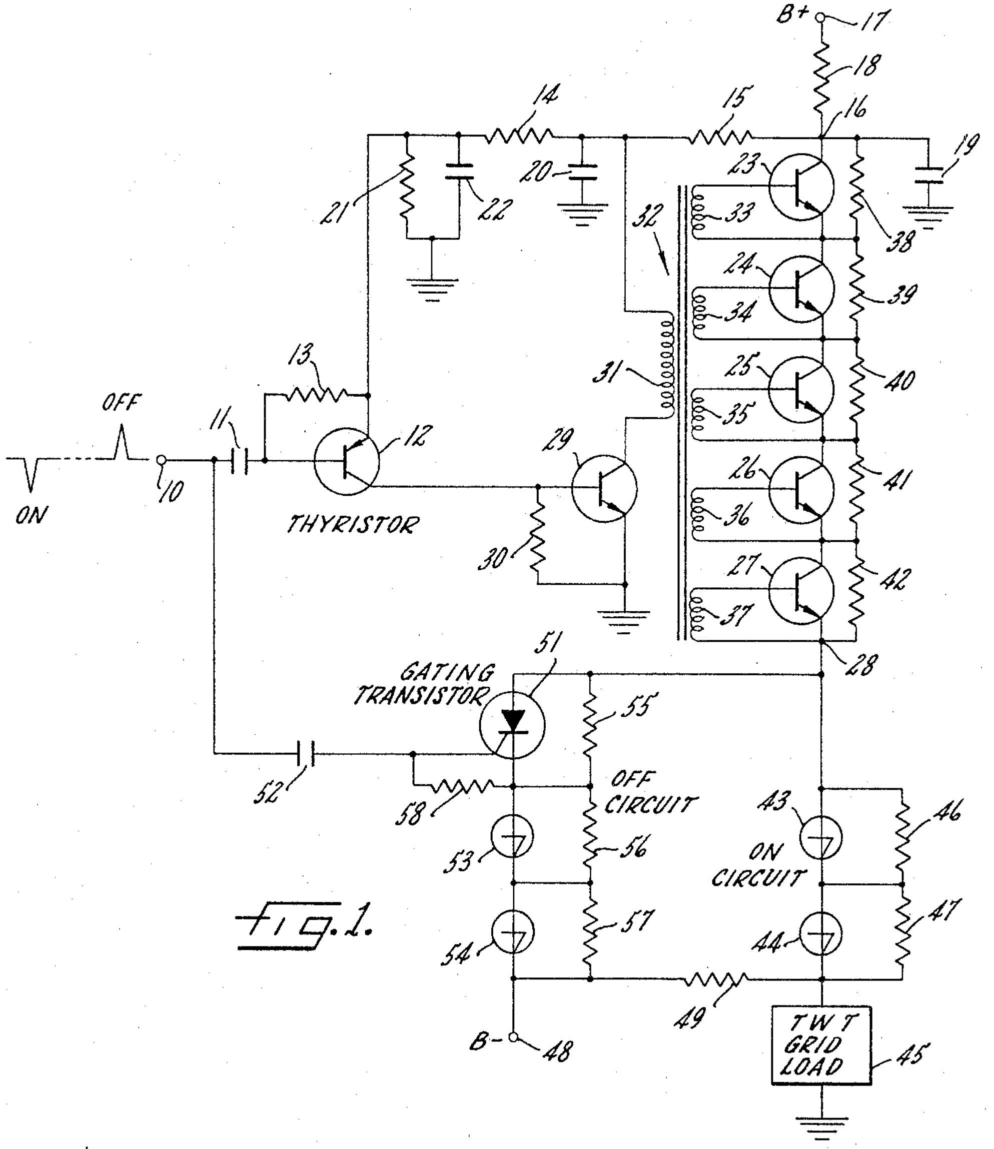
FIGURE 1 is a circuit schematic diagram of a solid state embodiment of the invention.

Referring more particularly to FIGURE 1, a solid state modulator circuit is shown which is triggered "on" and "off" by "on" and "off" trigger pulses applied to an input terminal 10. The input terminal 10 is coupled through a coupling capacitor 11 to the base electrode of a thyristor 12 having the base and emitter electrodes coupled through a resistor 13. The emitter of thyristor 12 is coupled through resistors 14 and 15 in series to a terminal point 16, this terminal point 16 being coupled to a B+ voltage terminal 17 through a resistor 18. The terminal 16 is coupled to one plate of a capacitor 19, the opposite plate of which is grounded to provide an RC constant for the terminal point 16. The junction of resistors 14 and 15 is coupled to one plate of a capacitor 20, the opposite plate of which is grounded. The emitter of thyristor 12 is likewise coupled to a parallel network consisting of a resistor 21 and a capacitor 22 with the opposite terminal of the parallel network coupled to ground. The capacitors 20 and 22 provide storage for the load voltages and the resistor 21 establishes the load voltage for the thyristor 12. Terminal 16 is coupled directly to the collector terminal of a first transistor 23 in a series of five transistors 24 through 27 the emitter of the last transistor 27 being coupled to a terminal 28. Five transistors are used in series to handle the high voltage required although a more or less number may be used depending on voltage requirements. The collector of the thyristor 12 is coupled directly to the base terminal of a triggering transistor 29, the emitter of which is coupled directly to ground. The base electrode of transistor 29 is biased from ground source through a base biasing resistor 30. The collector of transistor 29 is connected through the primary winding 31 of a transformer 32 to the common terminals of resistors 14 and 15. Each of the series of transistors 23 through 27 has its base and emitter coupled through a secondary winding identified by reference characters 33 through 37. Each of the series of transistors 23 through 27 has a resistance coupled in parallel therewith identified by the reference characters 38 through 42 to provide proper voltage drop across each transistor. The terminal 28 is coupled through a pair of 4-layer semiconductor diode switches 43 and 44 in series to a load circuit herein designated as being the grid load circuit of a traveling wave tube shown by the block 45. Each 4-layer semiconductor diode 43 and 44 has a resistance 46 and 47, respectively, coupled in parallel therewith. The number of diodes and parallel resistors are used to suit the voltage requirements across them. The traveling wave tube grid load is biased to cut off from a negative voltage source at terminal 48 through a biasing resistor 49. The part of the circuit including the transistors 23 through 27 in series and the two 4-layer series coupled semiconductor diodes 43 and 44 in series with the transistors constitute the "on" circuit for the traveling wave tube grid load.

Input terminal 10 likewise couples the gating terminal of a gating transistor 51 through a coupling capacitor 52. The gating transistor 51 has its anode directly coupled to terminal 28 and its cathode coupled in series through a pair of 4-layer series coupled semiconductor diode switches 53 and 54 to the negative voltage terminal 48. The gating transistor 51 and the two 4-layer diodes 53 an 54 each have resistors 55, 56, and 57, respectively, coupled in parallel therewith to produce the proper bias across the anodes and cathodes of these elements to maintain these elements in a normally cut off condition. The cathode and gating terminal of the gating transistor 51 has a resistance 58 coupled therebetween to produce a zero or cutoff bias on the gating terminal of this transistor. The gating transistor and the two 4-layer diodes in series and related circuitry constitute the "off" circuit for the solid state modulator.

OPERATION OF FIGURE 1

In the operation of FIGURE 1 a negative "on" pulse applied to terminal 10 will be applied through the capacitors 11 and 52 to the base of thyristor 12 and the gating terminal of gating transistor 51 simultaneously. Since a zero bias on the gating terminal of gating transistor 51 maintains this transistor in a nonconductive state, the negative "on" pulse applied to this gating terminal is of no effect. The negative "on" pulse on the base of thyristor 12 immediately places the thyristor in a conductive state which will continue by virtue of the characteristics of the thyristor mentioned hereinabove until the "off" pulse is applied. Conduction of thyristor 12 raises the base voltage of transistor 29 above its emitter voltage to produce a pulse in the primary 31 of transformer 32. Primary winding excitation immediately produces excitation of all the secondaries 33 through 37 to produce immediate conduction of transistors in series 23 through 27 to place substantially the B+ voltage from terminal 17 on the anodes of the 4-layer diodes 43 and 44 switching these diodes "on" and thereby applying substantially the B+ voltage at 17 on the traveling wave tube grid load 45. The rapid operation of the thyristor in combination with the transistor 29 with the thyristor remaining in its conductive state although the "on" pulse has terminated, causes an operation like that of a multivibrator which is instantaneous through the transformer 32 to turn on the "on" circuit to provide a rapid rise time in the modulating pulse applied to the traveling wave tube grid load 45. The B+ voltage source at 17 will continue in application to the traveling wave tube grid load 45 by virtue of the voltage storage on the capacitor 19, being reduced only by the drop across the resistor 18 and the resistance inherent in the series string of transistors and 4-layer diodes. The length of the pulse is not so great as to be cut off or reduced by collapse of the iron core flux in the transformer 32. When the "off" pulse is applied at the input terminal 10, it will immediately raise the base voltage of thyristor 12 to near its emitter voltage thereby cutting off this thyristor and at the same time this pulse will be applied to the gating terminal of the gating transistor 51 placing gating transistor 51 immediately in a conductive state. The conductive state of gating transistor 51 applying voltage from the terminal 28 to the anodes of the 4-layer diodes 53 and 54 immediately places these diodes in a conductive state. This provides immediate connection from the negative voltage source at terminal 48 to the terminal 28 reducing the current flow through the 4-layer diodes 43 and 44 immediately cutting off conduction therethrough and the B+ voltage supply at 17 to the traveling wave tube grid load. At the same time this operation immediately applies substantially the B− voltage at terminal 48 to the traveling wave tube grid load bringing this grid voltage back to the negative bias from terminal 48 through the bias resistor 49. From the above it should be clear that "on" and "off" pulses applied at terminal 10, in that sequence, will produce modulating pulses on the grid load of the traveling wave tube 45 which have rapid rise and fall times on the leading and trailing edges with a substantially constant plateau area therebetween.

Figure 3:
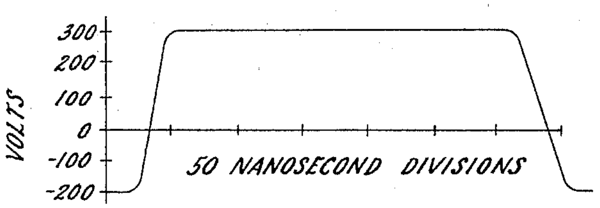
FIGURE 3 is a volt-time graph of a modulating pulse produced by the invention.

One modulating wave pulse produced is more clearly shown in FIGURE 3 when substantially high B+ and low B− voltages are used, for example, a B+ voltage in the order of 350 volts and a B− voltage in the order of −250 volts. As may be seen in FIGURE 3 the traveling wave tube grid load 45 may be biased to about −200 volts through the biasing resistor 49 and upon the application of an "on" pulse at terminal 10 this grid load voltage will rise rapidly as shown in FIGURE 3 to approximately 300 volts in about 15 ns. This voltage will remain substantially constant around 300 volts positive until the "off" pulse is applied to terminal 10 at which time the +300 volts on the grid load 45 will drop back to approximately −200 volts. This fall time occurs over a period of about 40 ns. These modulating pulses, as shown in FIGURE 3, will be repeated as often as the series of "on" and "off" pulses are applied to the input terminal 10. The rapid rise and fall times of these modulating pulses are possible by the use of the 4-layer semiconductor diodes which are extremely fast acting in their switching operations and in view of the combination of the 4-layer transistor switching diodes with the thyristor and transistor multivibrator circuit and the series transistor circuit.

Figure 2:
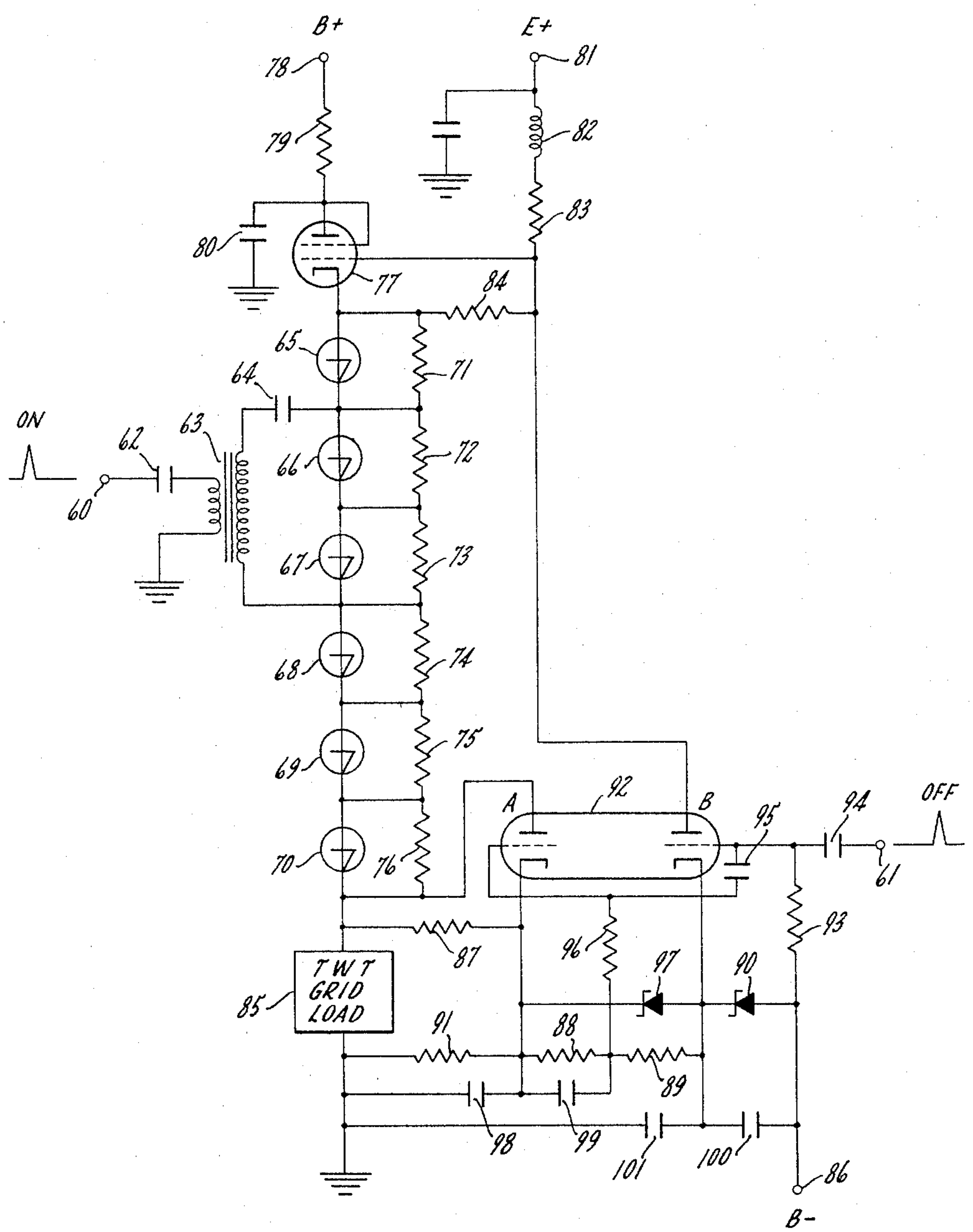
FIGURE 2 is a circuit schematic diagram of another embodiment providing a hybrid modulator in accordance with this invention.

In the hybrid embodiment of the modulating circuit shown in FIGURE 2 the "on" pulses are applied at terminal 60, while "off" pulses are applied to terminal 61. The input terminal 60 is coupled through a coupling capacitor 62 and the primary winding of a coupling transformer 63 to a fixed potential, such as ground. The secondary winding of coupling transformer 63 is coupled through a capacitor 64 in series and with the winding in parallel to two of a series of 4-layer semiconductor switching diodes shown and identified herein by reference characters 65 through 70. While six 4-layer diodes are used in this illustration to handle the voltage necessary to switch the travelling wave tube grid load voltage, the number used depends on the voltage requirements such that the voltage differential across each diode is not too high to be damaging to the diode. While the secondary winding of transformer 63 is shown coupled across the 4-layer diode 66 and 67, it is to be understood that this coupling can be across any other two or three or more of the diodes to accomplish switching of the diodes from a nonconductive state to a conductive state. The series coupled 4-layer diodes 65 through 70 each has a resistance coupled in parallel therewith to provide proper bias across these diodes to maintain them in a nonconductive state. These resistors are identified by reference characters 71 through 76 in parallel with the diodes 65 through 70, respectively. The anode of the first 4-layer diode 65 in the series string is coupled directly to the cathode of a tetrode 77, the anode of which is connected to a B+ voltage source at terminal 78 through an anode load resistor 79. The screen grid and the anode of the tetrode 77 are coupled to one plate of a capacitor 80, the opposite plate of which is grounded. The control grid of the tetrode 77 is coupled to an E+ voltage source at terminal 81 through series coupled inductance 82 and resistance 83. The control grid of the tetrode 77 is also coupled to the cathode through a resistor 84. The inductance 82 holds off the grid rise to allow time for recovery of the 4-layer diodes. The cathode of the last 4-layer diode 70 in the series string is coupled directly to a traveling wave tube grid load identified by the block 85. The grid load 85 is biased from a high B− voltage source at terminal 86 through biasing resistors 87, 88, and 89, and a Zener diode 90. The terminal junction of resistors 87 and 88 is connected to ground through a resistor 91. A twin triode tube 92, having triode sections A and B, has the grid of triode section B biased from the negative voltage source 86 through a biasing resistor 93. The grid of the triode section B is coupled through a coupling capacitor 94 to terminal 61 to which the "off" pulses are applied. The triode section B has its grid coupled to the grid of the triode section A through a capacitor 95, the grid of triode section A being biased through the biasing resistor 96 from the junction point of resistors 88 and 89. The cathode of triode section A is coupled to the junction of the resistors 88 and 91, while the cathode of triode section B is coupled to the junction of the Zener diode 90 and resistor 98. The cathodes of triode sections A and B are likewise coupled through a Zener diode 97 for establishing cathode bias. The resistor 91 has a capacitor 98 in parallel therewith and the resistor 88 has a capacitor 99 in parallel therewith. The Zener diode 90 has a capacitor 100 coupled in parallel therewith, while the junction of Zener diodes 90 and 97 and resistor 89 is coupled to one plate of a capacitor 101, the opposite plate of which is connected to ground potential. These capacitors filter out any alterntaing currents to ground. The anode of the triode section A of twin triode 92 is directly coupled to the grid load, while the anode of the triode section B is coupled directly to the control grid of the tetrode 77. The tetrode 77 in series from the positive voltage source 78 and in series with the series string of 4-layer semiconductor switching diodes 65 through 70 to the grid load constitute the "on" circuit, while the twin triode tube circuit 92 and its related circuity constitute the "off" circuit.

OPERATION OF FIGURE 2

In the operation of FIGURE 2, the tetrode 77 will be normally conducting by self-biasing of this tube through the resistor 84, it being understood that the B+ voltage at 78 will be higher than the E+ voltage at terminal 81. For the purpose of example herein the B+ voltage may be +550 volts, the E+ voltage +350 volts, and the B− voltage −500 volts. The 4-layer diodes 65 through 70 will be nonconducting by virtue of the various resistors 71 through 76 applying substantially equal potential thereacross from the B− source 86. When an "on" pulse is applied to terminal 60, a voltage differential will be placed across the 4-layer diodes, in this illustration being diodes 66 and 67, which will exceed their switching current turning these two diodes "on" at which time they immediately switch "on" all the diodes in the string 65 through 70. This will immediately place a high positive voltage on the grid load 85 of the traveling wave tube from the B+ source 78. As may be seen in FIGURE 3 the grid load was biased to a negative voltage from the B− source at 86 prior to the "on" pulse. Upon application of the "on" pulse, the grid load will rise immediately to the positive voltage nearing the voltage applied at terminal 78 or about +300 volts. Once the 4-layer diodes 65 through 70 are placed in conduction or switched "on," the cathode voltage of tetrode 77 drops from about 400 volts to 300 volts and the control grid voltage will be held at substantially zero with respect to the cathode which maintains tube conduction from the B+ voltage source 78 to the grid load 85 although the "on" pulse has terminated. This will maintain the plateau voltage as shown in FIGURE 3 on the grid load of the traveling wave tube 85. Upon the application of an "off" pulse applied to terminal 61, both triode tube sections A and B of twin triode 92 will be switched into conduction. Conduction of the triode section A will immediately place the negative cathode voltage in circuit to the grid load and simultaneously therewith the control grid of tetrode 77 will be placed in circuit with the negative cathode voltage of the triode section B of twin triode 92 immediately to cut off conduction of tetrode 77 and, consequently, the 4-layer diode string 65 through 70 and simultaneously therewith reduce the grid load voltage on the traveling wave tube 85 to approach the B− source 86. This operation will again substantially reproduce the modulating wave illustrated in FIGURE 3 to produce rapid rise and fall times for each and all modulating pulses produced by a series of "on" and "off" pulses applied to terminals 60 and 61.

While many modifications and changes may be made in the constructional details and features or circuit arrangement of the embodiments shown herein to produce rapid rise and fall time modulating pulses without departing from the spirit and scope of the combination of elements taught herein, it is to be understood that we desire to be limited only by the spirit and scope of the appended claims.

We claim:

1. A modulating circuit comprising:

a load circuit having a negative bias thereon from a negative voltage source through a biasing resistor;

a first circuit including a plurality of 4-layer semiconductor switching diodes in a series string coupled in series with a first electron emission means having conduction control electrode means, this series string of diodes and electron emission means being coupled between a positive voltage source and said load circuit with said first electron emission means adjacent said voltage source and said diodes adjacent said load;

induction means coupling said series string of diodes and electron emission means to switch same into conduction upon the application of a first pulse thereto;

a second circuit including a second electron emission means having conduction electrodes coupled to said diodes and first electron emission means string and to said negative voltage source, said second electron emission means also having a conduction control electrode coupled to receive a second pulse thereon to place said second electron emission means into conduction to apply said negative voltage source to said diodes and first electron emission string switching off conduction from said positive voltage source through said string and to said load circuit reducing the voltage across said biasing resistor to said biasing voltage whereby switching of conduction and nonconduction in said diodes and first electron emission means string produces modulating voltages on said load circuit having fast rise and fall leading and trailing edges.

2. A modulating circuit as set forth in claim 1 wherein said first and second circuits are "on" and "off" circuits.

3. A modulating circuit as set forth in claim 2 wherein said first electron emission means are a plurality of transistors in series, the bases of which are transformer coupled in the emitter-collector circuit of a trigger transistor, the base of the latter being coupled in the emitter-collector circuit of a thyristor, said thyristor having said one pulse applied to the base thereof to initiate conduction in said "on" circuit.

4. A modulating circuit comprising:
a load circuit having a negative bias thereon through a resistor from a negative voltage source;
a plurality of serially coupled transistors;
a plurality of serially coupled 4-layer semiconductor diodes, said serially coupled transistors and said serially coupled diodes being serially couped with one end of the series coupled to a positive potential and the other end of the series coupled to said load circuit;
a transistor multivibrator having an input for receiving trigger pulses and an output transformer coupled to the bases of said plurality of transistors for switching said series of transistors and diodes into conduction; and
a gating semiconductor coupled in series with a plurality of 4-layer semiconductor diodes, one end of said series being coupled to a junction of said plurality of transistors and said diodes and the other end of said series being coupled to said negative voltage source, said gating electrode of said gating semiconductor being coupled to said input to receive said trigger pulses whereby said trigger pulses switch said 4-layer semiconductor diodes to produce sharp rise and fall time modulating pulses on said load circuit.

5. A solid state modulating circuit as set forth in claim 4 wherein
said transistor multivibrator includes a thyristor and a transistor with the output transformer coupling in the collector circuit thereof and the base thereof coupled in the collector circuit of said thyristor, said thyristor base being said multivibrator input to receive said trigger pulses.

6. A solid state modulating circuit as set forth in claim 5 wherein
said plurality of serially coupled transistors, said plurality of serially coupled 4-layer semiconductor diodes, and said gating semiconductor are each coupled in parallel with a resistance.

7. A hybride modulating circuit comprising:
a load circuit having a negative bias thereon through a resistor from a negative voltage source;
a plurality of 4-layer semiconductor diodes and an electron emission device in series from a positive voltage source to said load circuit with said electron emission device adjacent said positive voltage source and said diodes adjacent said load, said electron emission device having a conduction control electrode;
an input transformer coupled to at least one of said diodes for applying pulses to render said series of diodes conductive; and
an electron emission triode means having two conduction electrodes and a conduction control electrode, said conduction electrodes being coupled between said load circuit and said negative voltage source and between said control conduction electrode of said electron emission device and said negative voltage source, and said control electrode being coupled to an input pulse source, which pulse, when applied, will render said electron emission triode means conductive to connect said negative voltage source to said conduction control electrode of said electron emission device and to said load circuit bypassing said resistor to cut off said positive voltage source to said load circuit whereby rendering said series diodes conductive and nonconductive produce modulating wave pulses with fast rise and fall leading and trailing edges on said load circuit.

8. A hybrid modulating circuit as set forth in claim 7 wherein
said electron emission device and said electron emission means are vacuum tubes, the first of which is normally conducting and the latter of which is normally biased to cut off by said negative voltage source.

9. A hybride modulating circuit as set forth in claim 8 wherein
said 4-layer diodes are each in parallel with a resistance.

References Cited by the Examiner

UNITED STATES PATENTS

| | | | |
|---|---|---|---|
| 3,079,514 | 2/1963 | Fischman | 307—88.5 |
| 3,184,653 | 5/1965 | Hutson | 307—88.5 |

OTHER REFERENCES

Solid State Design, Four-Layer Diode Pulse Modulators, July 1962, pp. 53–55 relied on.

JOHN W. HUCKERT, *Primary Examiner.*

L. ZALMAN, J. D. CRAIG, *Assistant Examiners.*